United States Patent
Van Den Brink et al.

(10) Patent No.: US 7,420,369 B2
(45) Date of Patent: Sep. 2, 2008

(54) SYSTEM AND METHOD FOR MAGNETIC RESONANCE IMAGING

(75) Inventors: Johan Samuel Van Den Brink, Eindhoven (NL); Paul Royston Harvey, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 51 days.

(21) Appl. No.: 11/568,331

(22) PCT Filed: Apr. 26, 2005

(86) PCT No.: PCT/IB2005/051355

§ 371 (c)(1), (2), (4) Date: Oct. 26, 2006

(87) PCT Pub. No.: WO2005/106519

PCT Pub. Date: Nov. 10, 2005

(65) Prior Publication Data

US 2007/0222447 A1  Sep. 27, 2007

(30) Foreign Application Priority Data

May 3, 2004 (EP) .................................. 04101885

(51) Int. Cl.
*G01V 3/00* (2006.01)
(52) U.S. Cl. ...................................... 324/307; 324/309
(58) Field of Classification Search ......... 324/300–322; 600/407–455, 529–539; 435/7.1
See application file for complete search history.

(56) References Cited

U.S. PATENT DOCUMENTS

| | | | | |
|---|---|---|---|---|
| 4,742,304 | A | * 5/1988 | Schnall et al. | 324/318 |
| 5,675,254 | A | * 10/1997 | Fiat et al. | 324/318 |
| 5,684,398 | A | * 11/1997 | Takiguchi et al. | 324/306 |
| 5,869,023 | A | 2/1999 | Ericcson et al. | |

(Continued)

OTHER PUBLICATIONS

Foo, T.K.F., et al.; Automated Detection of Bolus Arrival and Initiation of Data Acquisition in Fast, Three-dimensional, Gadolinium-enhanced MR Angiography; 1997; Radiology; 203(1)275-280.

(Continued)

*Primary Examiner*—Brij B Shrivastav

(57) ABSTRACT

In order to provide a magnetic resonance imaging system and method which allows an optimal timing of the imaging sequence at minimal procedure cost, a magnetic resonance imaging system and method is proposed, wherein a first MR scan of a structure of interest is performed for detecting the arrival of a contrast bolus in the structure of interest, the first MR scan using a first resonance frequency corresponding to first MR sensitive nuclei, the first performing step is repeated at least until the bolus arrival in the structure of interest has been detected, and a second MR scan of the structure of interest is performed for acquiring a MR image, the second MR scan using a second resonance frequency corresponding to second MR sensitive nuclei, the second nuclei being different from the first nuclei.

14 Claims, 2 Drawing Sheets

U.S. PATENT DOCUMENTS

| | | |
|---|---|---|
| 6,400,154 B2 * | 6/2002 | Tomanek et al. ............ 324/318 |
| 6,589,506 B2 | 7/2003 | Cremillieux et al. |
| 6,595,211 B2 * | 7/2003 | Weiler et al. ........... 128/204.18 |
| 6,603,992 B1 * | 8/2003 | Debbins et al. ............. 600/420 |
| 6,696,838 B2 * | 2/2004 | Raftery et al. .............. 324/321 |
| 2002/0043267 A1 | 4/2002 | Weiler et al. |
| 2002/0091316 A1 | 7/2002 | Foo et al. |

OTHER PUBLICATIONS

Levy, R.A., et al.; Arterial-Phase Three-Dimensional Contrast-Enhanced MR Angiography of the Carotid Arteries; 1996; AJR; 167; pp. 211-215.

Sodak, C. H., et al.; A New Perfluorocarbon for Use in Fluorine-19 Magnetic Resonance Imaging and Spectroscopy; 1993; MRM; 29:188-195.

* cited by examiner

SYSTEM AND METHOD FOR MAGNETIC RESONANCE IMAGING

The invention relates to a system and method for magnetic resonance (MR) imaging.

MR imaging techniques using the $^1$H nucleus (proton) are well known in the prior art. One of these techniques is the contrast-enhanced Magnetic Resonance Angiography (MRA). Here, a bolus of contrast agent is injected intravenously, causing a shortening of the relaxation time for T1 weighted images. Contrast-enhanced MRA can be used as a way of reducing the dependence on blood flow for image contrast. Selective imaging of the arterial signal can be performed by delaying image acquisition using a pre-determined bolus arrival time obtained from a test bolus. Alternatively the actual in-situ arrival of the bolus can be detected using a fluoroscopic MR sequence, followed by a rapid switch to a high resolution imaging sequence, as described in Foo, T. K. et al. "Automated detection of bolus arrival and initiation of data acquisition in fast, three-dimensional, gadolinium-enhanced MR angiography" Radiology 1997 April; 203(1), pages 275-280.

During the last years attention has been paid to MR imaging techniques using magnetic resonance signals originating from nuclei other then proton. An important problem in MR imaging of non-proton nuclei is the low signal-to-noise ratio (SNR) for imaging such nuclei. The reasons for the low SNR are among other things the much lower natural abundance of such nuclei compared with protons, their lower gyromagnetic ratio, and the low concentration of enriched substances. To overcome this problem and to achieve a sufficient SNR, the polarization of the nuclei can be enhanced by several methods. One of these methods is to hyperpolarize these nuclei. Hyperpolarized chemical species are considered to be especially useful for angiographic purposes. Agents that can be designed to retain within the vasculature will allow for selective vascular imaging. This approach, however, comes with several problems. The lifetime of the polarization in vivo is limited, being prohibitive of waiting for an adequate steady-state enhanced signal from the fall vasculature (both arteries and veins), thus requiring first-pass imaging, preferably targeted to the arterial phase. The timing of the bolus arrival can be estimated using a separate scan (employing a so-called test bolus). This is a costly experiment when the hyperpolarized species itself must be used, since it requires a second dose of contrast material. Another mode to detect the unknown contrast bolus arrival time is to employ a fluoroscopic sequence. This requires RF pulses that will effectively spoil the polarized longitudinal magnetization, being prohibitive of detecting the bolus with the hyperpolarized magnetization itself. For imaging the hyperpolarized contrast agent only a limited time is available.

It is therefore an object of the present invention to provide a magnetic resonance imaging system and method which allows an optimal timing of the imaging sequence at minimal procedure cost.

This object is achieved according to the invention by a magnetic resonance (MR) imaging method, the method comprising the steps of performing a first MR scan of a structure of interest for detecting the arrival of a contrast bolus in the structure of interest, the first MR scan using a first resonance frequency corresponding to first MR sensitive nuclei, repeating the first performing step at least until the bolus arrival in the structure of interest has been detected, performing a second MR scan of the structure of interest for acquiring a MR image, the second MR scan using a second resonance frequency corresponding to second MR sensitive nuclei, the second nuclei being different from the first nuclei.

The object of the present invention is also achieved by a MR imaging system comprising an acquisition module for acquiring first magnetic resonance signals from a structure of interest for detecting the arrival of a contrast bolus in the structure of interest, thereby using a first resonance frequency corresponding to a first MR sensitive nucleus, and for repeatedly acquiring first magnetic resonance signals at least until the bolus arrival in the structure of interest has been detected, the acquisition module being adapted for acquiring second magnetic resonance signals from the structure of interest for acquiring a MR image, thereby using a second resonance frequency corresponding to a second MR sensitive nucleus, the second nuclei being different from the first nuclei.

The invention is based upon the idea to accurately determine the arrival of a contrast agent in situ. The invention teaches that bolus arrival time detection is performed using dedicated magnetic resonance signals from nuclei other than the dedicated species used for the actual MR imaging sequence.

These and other aspects of the invention will be further elaborated on the basis of the following embodiments which are defined in the dependent claims.

In a preferred embodiment of the invention the bolus administered comprises first and second nuclei. After detecting the arrival of the bolus in the structure of interest by a first MR detecting or scout scan using the first nuclei, a second MR scan is performed in order to acquire images of the structure of interest, the second MR scan using the second nuclei.

Preferably the second MR scan is carried out immediately after the contrast bolus has been detected. The delay depends on the switching time of the MR system for switching between the first and second MR scan procedures.

In another embodiment of the invention, a test bolus approach is used, wherein a first MR scan is performed using first nuclei from a test bolus. After detecting the bolus arrival time in the structure of interest a second MR scan is performed for acquiring MR images of the structure of interest, thereby using second nuclei different from the first nuclei. These second nuclei are preferably administered as a second bolus. It is to be understood that the first contrast bolus may contain only first nuclei, or can be composed of a mixture of first and second nuclei. The latter method is preferred as it will better represent the biophysical properties and retention time of the actual contrast bolus. In this case, the second nuclei are preferably not hyperpolarized for the test bolus.

In a preferred embodiment of the invention the contrast bolus comprises hyperpolarized species used for the MR imaging sequence and non-polarized first nuclei used for the bolus arrival detection. Detection of the in-situ contrast arrival is performed at a different MR frequency than that required for imaging the hyperpolarized species. The species used for bolus detection is characterized by an adequate sensitivity at natural polarization, preferably $^{19}$F, or $^1$H enhanced by Gd or Dy chelates. When detecting at $^{19}$F frequency, perfluoronated fluoro-carbons can be employed. To avoid toxic reactions, these are preferably embedded in micelles.

Imaging of the bolus arrival at a substantially different frequency than that of the hyperpolarized species, preferably $^{13}$C, will not destroy the hyperpolarization. In other words, the magnetization of the hyperpolarized nuclei is retained. After detection of the contrast bolus in the structure of interest a second imaging sequence for the nucleus with hyperpolarized magnetization is performed to obtain images for e.g. angiographic purposes.

In another embodiment of the invention a hyperpolarized signal is used for bolus arrival detection. Here, a nucleus is employed other than that used for the actual angiographic imaging sequence, e.g. $^{129}$Xe is used for bolus arrival detection, while $^{13}$C will be employed in the angiographic imaging sequence.

In yet another preferred embodiment of the invention a time-resolved fluoroscopic imaging method, i.e. a thick-slab 2D dynamic scan, is used for detecting the bolus arrival. Here, the operator monitors the contrast arrival on a series of dynamic images, and initiates the switch to the actual imaging sequence, e.g. for angiographic purposes. The known method of fluoroscopic bolus arrival detection is modified such, that the detection of bolus arrival does not affect the spin (hyper) polarization. This is achieved by detecting the bolus arrival at a significantly different MR frequency, preferably $^{19}$F.

If relaxation-enhanced proton MR signals are used as first nuclei, preferably a dynamic subtraction method is applied, i.e. the fluoroscopic images only show the contrast difference. Alternatively non-proton nuclei may be used as first nuclei. Here, no subtraction is required.

In another embodiment of the invention a 2D-RF pulse is employed for cylindrically-shaped localized excitation ("pencil beam"), while a 1D readout is used. Alternatively, the required 2D localization is achieved by consecutive orthogonal RF excitations (e.g. 90x-180y). The location of the 2D volume is preferably targeted for one of the major body vessels (vena cava or aorta). Thereby the MR system detects the change in MR signal corresponding to the contrast arrival. Upon detection of contrast arrival, a rapid switch of imaging sequence is automatically initiated to perform a high-resolution MR imaging sequence.

According to a further aspect of the invention the first MR "scout" scan is preferably performed at a short acquisition time at low spatial resolution, while in the subsequent imaging mode, the second MR scan is performed preferably at high spatial resolution at the expense of longer acquisition time.

The devices for acquiring magnetic resonance signals are generally well known from the prior art. Such a MR system include inter alia coils for creation of gradient magnetic fields, current supply devices, high frequency generators, control devices, RF signal antennae, readout devices etc. All appliances are adapted to carry out the method according to the present invention. In particular, the MR system is adapted to provide a rapid switching functionality to image at the frequency of the hyperpolarized species. Thus, the MR system according to the invention enables imaging at multiple frequencies, according to the different gyromagnetic ratios of the different nuclei. The MR system is adapted to provide low switching and settling times between the different frequencies. Preferably the MR system comprises multiple independent RF transmit and receive paths, especially (power) amplifiers, and RF filters. All MR system modules, e. g. the acquisition module including the control device for measuring time, frequency and amplitude parameters for the RF pulses, the gradients and the echo readout, are constructed and programmed in a way that the procedures for obtaining data and for data processing run in accordance with the method of the invention.

For providing dynamic images to the operator of the MR system, the MR system preferably comprises an imaging module for generating images of the structure of interest based on the first magnetic resonance signals and a displaying module for displaying these images to an operator.

The MR system preferably comprises an analyzing module for analyzing the first magnetic resonance signals. The analyzing module is preferably adapted for detecting the arrival of the contrast bolus in a structure of interest and/or for detecting the arrival time of the contrast bolus. Additionally the analyzing module is adapted for accommodating the actual imaging sequence for the waiting time as determined from the bolus arrival time, i.e. the acquisition of the MR image using the second resonance frequency is performed at a delay relative to bolus administration determined from the acquisition employing the first nucleus. In another embodiment, the analyzing module is preferably adapted for automatically initiating the actual imaging sequence, based on the results of the analysis.

The method according to the invention is preferably carried out using a computer connected with the MR system. Preferably the computer is an integral component of the MR system. The computer includes inter alia a central processor unit (CPU), a bus system, digital signal processing means including analogue-to-digital converters, memory means, e. g. RAM or ROM, storage means, e. g. floppy disk, CD, DVD, or hard disk units and input/output units.

The object of the present invention is also achieved by a computer program comprising computer instructions adapted to perform the MR imaging method according to the invention when the computer program is executed in a computer of a MR imaging system. The technical effects necessary to carry out the MR imaging method in accordance with the invention can thus be realized on the basis of the instructions of the computer program in accordance with the invention. Such a computer program can be stored on a carrier such as a CD-ROM or DVD, or it can be available over the internet or another computer network, or a (USB) memory stick can be employed Prior to executing the computer program is loaded into the computer by reading the computer program from the carrier, for example by means of a CD-ROM or DVD player, or from the internet, or from a memory stick, and storing it in the memory of the computer.

Another aspect of the invention relates to the contrast bolus administered according to the inventive method. To enable immediate bolus arrival with a fluoroscopic sequence, the contrast bolus contains at least two different MR sensitive nuclei. Preferably the contrast bolus contains two different nuclei other than proton. Preferably these different nuclei have sufficiently different gyromagnetic ratios, as they have by nature.

According to an embodiment of the present invention such a contrast bolus with multiple MR frequencies consists of a single chemical compound consisting of the at least two different nuclei. According to the invention a selectively enriched chemical compound with first nuclei at a certain position is used. The chemical compound is hyperpolarized for the first nuclei, without loosing polarization efficiency due to coupling to the other nuclei. Such a compound requires a careful compound selection and chemical synthesis.

According to another embodiment of the present invention a contrast bolus in form of a chemical compound or mixture of compounds is used, that contain(s) both the nucleus with its hyperpolarized signal, and the nucleus used for fluoroscopic bolus arrival detection. The advantage of mixing different species is the easier organo-chemical synthesis pathways, as well as simpler biocompatibility. Furtheron, cross-relaxation between the different nuclei is less likely to affect the hyperpolarized signals. To improve biocompatibility, the chemical species are preferably embedded in vesicles or micelles.

According to yet another embodiment of the invention bolus consisting of a mixture of chemical species is used, one of which containing the hyperpolarized material, e.g. $^{13}$C, and the other the e.g. $^{19}$F nuclei. Mixing of the compounds is preferably delayed until injection time.

According to a further embodiment of the invention the two different contrast agents are administered simultaneously and preferably through the same pathway. This guarantees that the arrival time of the contrast is not affected by different path lengths for the different chemical species involved.

These and other aspects of the invention will be described in detail hereinafter, by way of example, with reference to the following embodiments and the accompanying drawings; in which.

Figure 1:
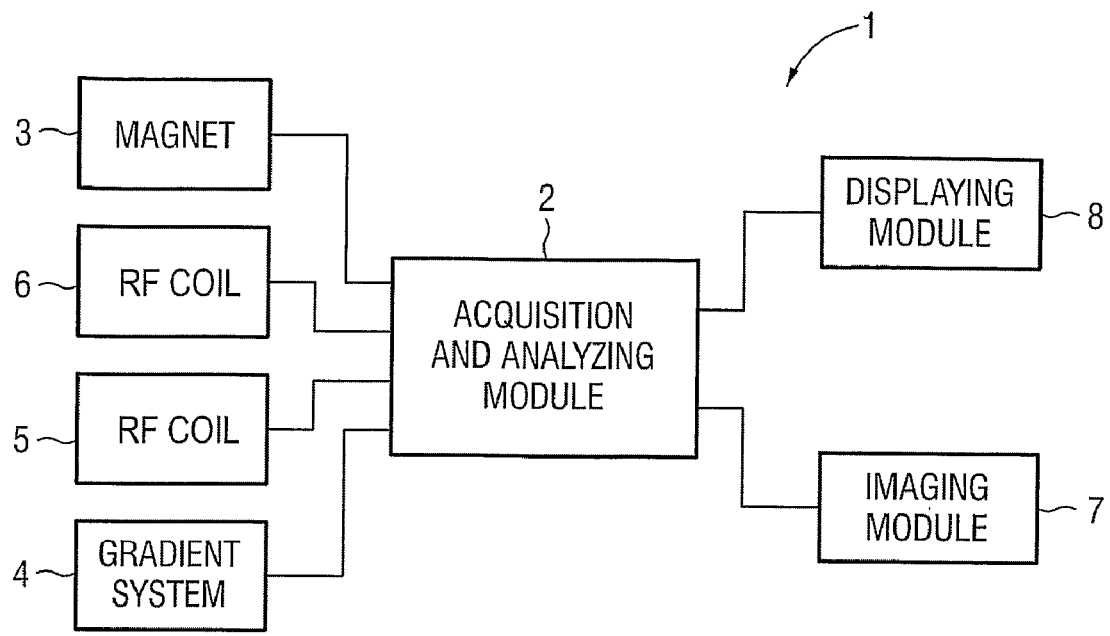
FIG. 1 is a block diagram showing an overview of a system on which the preferred embodiment can be implemented.

A typical MR imaging system on which the preferred embodiment can be implemented is shown in a simplified block diagram of FIG. 1. The imaging system 1 is adapted for contrast-enhanced multi-nuclear MR angiography (MRA), particularly for arterial-phase MRA using hyperpolarized contrast agents.

The imaging system 1 basically comprises a combined acquisition and analyzing module 2, a magnet 3 for generating the static magnetic field, a magnetic field gradient system 4, consisting of gradient amplifier and gradient coils for spatial selection and spatial encoding. Furthermore the imaging system 1 comprises RF amplifier and RF transmit coil for production of measurement pulses to excite the nuclei and RF receive coil and amplifier to detect the re-emitted signal from the nuclei. Transmit coil and receiver coil are electronically and physically integrated into RF coils 5, 6. Thereby RF coil 5 is adapted to the first resonance frequency corresponding to the first nuclei used for detecting the bolus arrival, whereas RF coil 6 is adapted to the second resonance frequency corresponding to the second nuclei used for the actual MRA imaging.

These components 3, 4, 5, 6 are connected to the acquisition and analyzing module 2 for data acquisition and control. The acquisition and analyzing module 2 comprises a computer system and computer programs adapted to run on this computer system. These computer programs are adapted to control the process of data acquisition, data analysis and system control. For example a pulse sequence program is used to control the sequence of measurement pulses applied to excite the nuclei. An image module 6, connected to the acquisition and analyzing module 2, is used for digital signal processing and image processing.

For automatically initiating the actual angiographic imaging sequence the acquisition and analyzing module 2 comprises the functionality of analyzing the first magnetic resonance signals and, based on the results of the analysis, automatically initiating the acquisition of the MR image using the second resonance frequency. In other words, the imaging system 1 is adapted to detect the contrast arrival time to enable first pass arterial MR angiography.

Furthermore the acquisition and analyzing module 2 includes an archiving system for storing and archiving raw data and image data and an operating and displaying module 7 for display of the images and for operator input of control parameters etc.

The imaging system 1 is adapted for multi-nuclear imaging. For this purpose multiple independent RF transmit and receive paths are provided. The imaging system 1 is adapted to rapidly switch between the first and second magnetic resonance frequency and between the first and second detection sequences.

Figure 2:
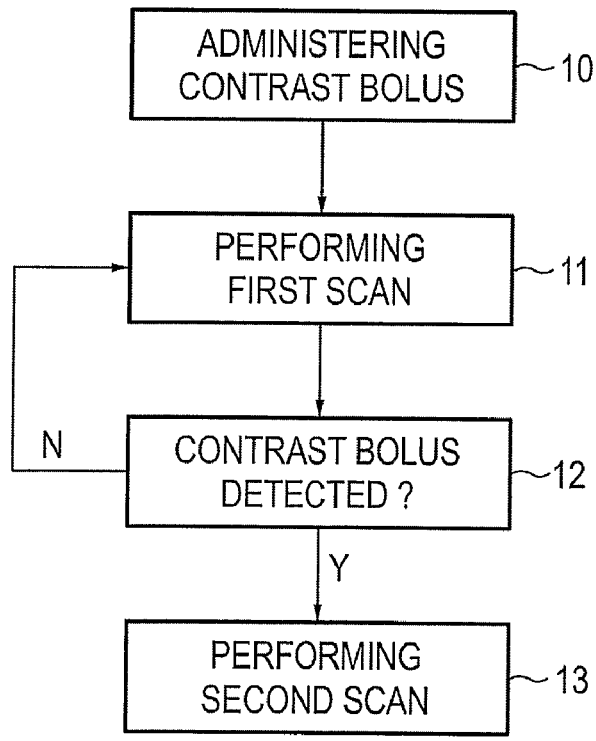
FIG. 2 is a flow chart showing the steps for carrying out the method according to a first embodiment of the invention.

The steps necessary to carry out a magnetic resonance imaging method according to the invention are illustrated in a simplified flow chart in FIG. 2.

According to this embodiment of the invention, in a first step 10 a contrast bolus comprising two different MR sensitive nuclei is administered to a human subject, e.g. intravenously using a two-way syringe with a double reservoir. The human subject is positioned in a scan position. For carrying out the present invention an image contrast enhancing composition for MR imaging comprising two different MR sensitive nuclei is employed. Thereby $^{19}$F is used as first nuclei and $^{13}$C is used as hyperpolarized second nuclei. In other words, the contrast bolus comprises two different contrast agents, which are administered simultaneously through the same pathway. The bolus is administered using a single dose ("first-pass"). The first contrast agent shows a first excitation frequency, which according to the present invention is used for bolus arrival detection, whereas the second contrast agent shows a second excitation frequency to be used for angiographic imaging.

For a timely start of a high-resolution angiographic imaging sequence the arrival of the bolus of hyperpolarized contrast agent at the region of interest is detected by a first MR scan of lower resolution during the next step 11. This scout scan, a localized excitation with a 1D readout, is performed using the first resonance frequency corresponding to the first nuclei of the contrast bolus. Thereby the RF pulses during the scout scan do not (or hardly) affect the hyperpolarization of the nuclei to be employed in the MRA imaging sequence.

The MR scan using this first resonance frequency is repeatedly carried out until the MR scan indicates that the contrast bolus has arrived in the structure of interest. This information is obtained by the analyzing module of the imaging system in step 12. Thereby a tracking pulse sequence to continuously monitor the MR signal can be employed. As the signal from this region increases because of the arrival of the contrast agent in the arterial structures, the acquisition module switches from the scout scan to the actual imaging scan. In other words, after detection of the contrast bolus in the structure of interest, a three-dimensional arterial phase MR angiography is performed for acquiring a MRA image in step 13. This fast MRA scan is carried out such that the arterial phase of the bolus infusion coincides with the acquisition of data from the center of k-space in the region of interest. The second scan is carried out using the second resonance frequency corresponding to the second nuclei of the contrast bolus. Thereby the second resonance frequency is substantially different from the first resonance frequency.

In another embodiment of the present invention, the switching between the scout scan an the actual imaging scan is performed by an operator using the operating and displaying module 7 for observing the arrival of the test bolus in the region of interest on a display and initiating the MRA sequence using an available control mechanism. Images displayed to the operator are generated by the imaging module 6 beforehand.

Figure 3:
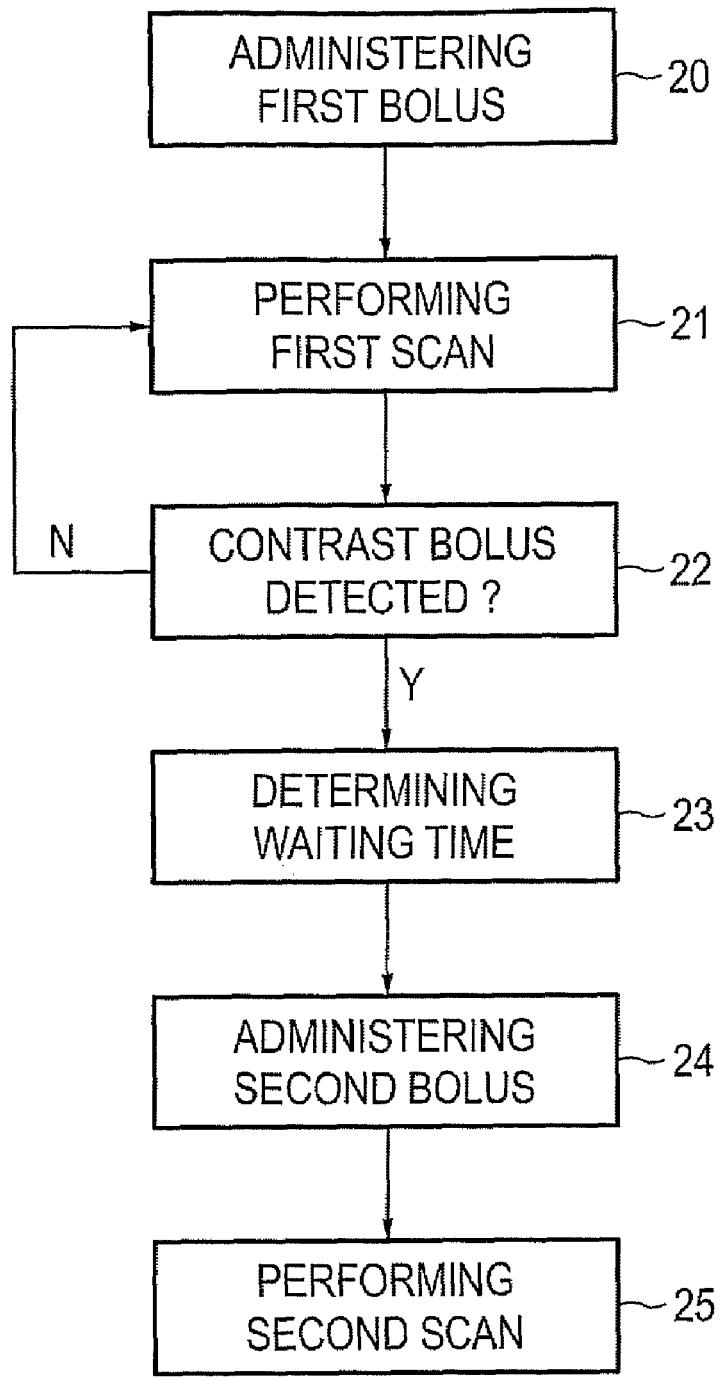
FIG. 3 is a flow chart showing the steps for carrying out the method according to a second embodiment of the invention.

According to still another embodiment of the invention, as illustrated in a simplified flow chart in FIG. 3, a test bolus is administered in a first step 20, the test bolus comprising first nuclei, e.g. $^{19}$F. In a next step 21 a first MR scan of a structure of interest is performed in order to detect the arrival of the test bolus in the structure of interest. The first MR scan employs a first resonance frequency corresponding to a first nuclei. When the arrival of the test bolus in the structure of interest has been detected, the bolus arrival time is determined 22.

A waiting time is determined 23 from the bolus arrival time by the analyzing module. Thereby different biophysical properties characteristics can be taken into account.

In a next step 24 a second contrast bolus is administered. Thereby the second contrast bolus comprises the second nuclei. Upon the administering of the second contrast bolus the waiting time starts. Finally, after expiration of the waiting time, a second MR scan of the structure of interest is performed 25 for acquiring a MRA image. The second MR scan is carried out using the same MR system and a different resonance frequency, which corresponds to the second nuclei.

The second bolus can be administered 24 after the waiting time has been determined 23. However, if the second bolus is administered earlier, the total time of the procedure can be reduced. In this case it has to be ensured that the waiting time to be determined will be longer than the time remaining after administering the second bolus.

According to still another embodiment of the invention the first MR scan of a structure of interest is performed using a first MR system, adapted for detecting the arrival of a contrast bolus in the structure of interest, whereas the second MR scan is performed using another MR system, different from the first MR system, the second MR system being adapted for acquiring a MR image of the structure of interest. Again, first and second MR systems employ different resonance frequencies in accordance with the nuclei used within the contrast agents. A patient support and transportation system can be provided to enable the patient to be scanned in a single procedure at both MR systems. Accordingly, the patient can be studied at two locations, or be scanned at a single location equipped with two MR systems. Instead of a MR system a non-MR system might be used for bolus arrival time detection, e. g. an ultrasound (US) system or a computer tomography (CT) system. A non-MR system would imply a contrast bolus consisting of a first component being CT or US visible (like micro-bubbles) in combination with (hyperpolarized) non-proton MR sensitive nuclei.

It will be evident to those skilled in the art that the invention is not limited to the details of the foregoing illustrative embodiments, and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. It will furthermore be evident that the word "comprising" does not exclude other elements or steps, that the words "a" or "an" does not exclude a plurality, and that a single element, such as a computer system or another unit may fulfil the functions of several means recited in the claims. Any reference signs in the claims shall not be construed as limiting the claim concerned.

The invention claimed is:

1. A magnetic resonance imaging method comprising the steps of:
    performing a first MR scan of a structure of interest for detecting the arrival of a first contrast bolus in the structure of interest, the first MR scan using a first resonance frequency corresponding to first MR sensitive nuclei;
    repeating the first performing step at least until the first contrast bolus arrival in the structure of interest has been detected; and
    performing a second MR scan of the structure of interest for acquiring a MR image, the second MR scan using a second resonance frequency corresponding to second MR sensitive nuclei, the second nuclei being different from the first nuclei;
    wherein the first contrast bolus comprises the first nuclei and a second contrast bolus comprises the second nuclei.

2. The method as claimed in claim 1, wherein the first and second contrast boluses form a single contrast bolus that comprises the first and second nuclei.

3. The method as claimed in claim 1, wherein the second nuclei are hyperpolarized nuclei.

4. The method as claimed in claim 1, wherein the first nuclei are protons and the first contrast bolus includes relaxation-enhancing substances affecting the MR signal from the protons.

5. The method as claimed in claim 1, wherein the first nuclei are non-proton nuclei.

6. The method as claimed in claim 1, wherein hyperpolarized first nuclei are used.

7. The method as claimed in claim 1, wherein the second MR scan is carried out after a waiting time determined from the bolus arrival time of the first MR scan.

8. The method as claimed in claim 1, wherein the second MR scan is initiated automatically based on the results of the first MR scan.

9. A magnetic resonance imaging system comprising an acquisition module for acquiring first magnetic resonance signals from a structure of interest for detecting the arrival of a first contrast bolus in the structure of interest, thereby using a first resonance frequency corresponding to a first MR sensitive nuclei, and for repeating acquiring first magnetic resonance signals at least until the first contrast bolus arrival in the structure of interest has been detected, the acquisition module being adapted for acquiring second magnetic resonance signals from the structure of interest for acquiring a MR image, thereby using a second resonance frequency corresponding to a second MR sensitive nuclei in a second contrast bolus, the second nuclei being different from the first nuclei, wherein acquiring second magnetic resonance signals is carried out after a waiting time determined from the first contrast bolus arrival time.

10. The system as claimed in claim 9, wherein the acquisition module comprises an analyzing module for analyzing the first magnetic resonance signals and, based on the results of the analysis, automatically initiating the acquisition of the MR image using the second resonance frequency.

11. The system as claimed in claim 9, wherein at least one of the first and second nuclei are hyperpolarized.

12. The system as claimed in claim 9, wherein the first nuclei are protons and relaxation-enhancing substances affecting the MR signal from these protons are used.

13. The system as claimed in claim 9, wherein the first nuclei are non-protons.

14. A computer-readable medium carrying a computer program comprising computer instructions to control a processor to:
    perform a first MR scan of a structure of interest for detecting the arrival of a first contrast bolus in the structure of interest, the first MR scan using a first resonance frequency corresponding to a first MR sensitive nuclei,
    repeat the first performing step at least until the first contrast bolus arrival in the structure of interest has been detected, and
    perform a second MR scan of the structure of interest for acquiring a MR image, the second MR scan using a second resonance frequency corresponding to a second MR sensitive nuclei in a second contrast bolus, the second nuclei being different from the first nuclei.

* * * * *